(12) United States Patent
Lee et al.

(10) Patent No.: US 8,883,377 B2
(45) Date of Patent: Nov. 11, 2014

(54) PHOTORESIST COMPOSITION FOR FORMING A COLOR FILTER AND METHOD OF MANUFACTURING A SUBSTRATE FOR A DISPLAY DEVICE

(75) Inventors: Sang-Hun Lee, Hwaseong-si (KR); Sun-Young Chang, Gwangmyeong-si (KR); Yun-Ho Lee, Cheonan-si (KR); Yui-Ku Lee, Asan-si (KR)

(73) Assignee: Samsung Display Co., Ltd. (KR)

( * ) Notice: Subject to any disclaimer, the term of this patent is extended or adjusted under 35 U.S.C. 154(b) by 110 days.

(21) Appl. No.: 13/618,295

(22) Filed: Sep. 14, 2012

(65) Prior Publication Data
US 2013/0295495 A1 Nov. 7, 2013

(30) Foreign Application Priority Data
May 3, 2012 (KR) ........................ 10-2012-0046628

(51) Int. Cl.
*G02B 5/20* (2006.01)
*G02F 1/1335* (2006.01)
*G03F 7/032* (2006.01)

(52) U.S. Cl.
USPC ............................................................ 430/7

(58) Field of Classification Search
None
See application file for complete search history.

(56) References Cited

U.S. PATENT DOCUMENTS 5,972,544 A * 10/1999 Carr et al. ........................ 430/7
7,358,033 B2    4/2008 Araki

FOREIGN PATENT DOCUMENTS

| JP | 2010-008915 A | * | 1/2010 |
| JP | 2011057838 A | | 3/2011 |
| JP | 2011118369 A | | 6/2011 |

OTHER PUBLICATIONS

Computer-generated translation of JP 2010-008915 (Jan. 2010).*

* cited by examiner

*Primary Examiner* — John A. McPherson
(74) *Attorney, Agent, or Firm* — Cantor Colburn LLP

(57) ABSTRACT

A photoresist composition for forming a color filter, the composition including a binder resin, a monomer, a photo initiator, a dye compound including epoxy group, and an organic solvent.

9 Claims, 2 Drawing Sheets

PHOTORESIST COMPOSITION FOR FORMING A COLOR FILTER AND METHOD OF MANUFACTURING A SUBSTRATE FOR A DISPLAY DEVICE

This application claims priority to Korean Patent Application No. 10-2012-0046628, filed on May 3, 2012, and all the benefits accruing therefrom under 35 U.S.C. §119, the content of which is herein incorporated by reference in its entirety.

BACKGROUND

1. Field

This disclosure relates to a photoresist composition for forming a color filter and a method of manufacturing a substrate e.g., a color filter for a display device. Additionally this disclosure relates to a photoresist composition for forming a color filter to improve a display quality and a method of manufacturing a substrate for a display device.

2. Description of the Related Art

Generally, a display device includes a display panel displaying an image using a light and a backlight assembly which provides the light to the display panel. The display panel includes a plurality of pixels, each of the pixels including a switching element, a pixel electrode, a common electrode and a color filter layer. The display panel uses a liquid crystal as a display element. The backlight assembly may irradiate a white light, and the light passes through the color filter layer. Thus, the light is changed into lights having various colors and the lights having various colors are mixed, so that the display device may display a color image. For example, the color filter layer includes a red color filter ("R"), a green color filter ("G") and a blue color filter ("B"). A light has each color when the light passes through the color filter and each of the color lights may represent various colors by mixing.

The color filter layer is manufactured using a composition for forming a color filter including a pigment. A pigment is used as a coloring agent which represents a color. However, there are limits to improving the transmittance of a color filter layer using the pigment alone. Thus, to avoid this limitation, a coloring agent including the pigment with a dye is used.

However, the dye is generally a single molecule, which has a small particle size, and the dye is vulnerable to heat, so that the structure of the dye may be easily changed by heat exposure. Thus, a color shift, which represents a different color from an original color of the color filter layer, and decolorization may occur, so that the color reproducibility and the display quality of the display device may be reduced. Thus, there remains a need for an improved photoresist composition for forming a color filter.

SUMMARY

Exemplary embodiments of this disclosure provide a photoresist composition to improve the thermal resistance of a photoresist composition for forming a color filter.

Exemplary embodiments of this disclosure also provide a method of manufacturing a substrate for a display device, and using the photoresist composition for forming the color filter.

In an exemplary embodiment of a photoresist composition for forming a color filter, the photoresist composition includes a binder resin, a monomer, a photo initiator, a dye compound including an epoxy group and an organic solvent.

In an exemplary embodiment, the photoresist composition may include about 5% to about 10% by weight of the binder resin, about 5% to about 10% by weight of the monomer, greater than 0% to less than about 1% by weight of the photo initiator, and about 5% to about 10% by weight of the dye compound, each based on a total weight of the photoresist composition.

In an exemplary embodiment, the binder resin may be reactive with the monomer, the photo initiator may be activated by a light and may be reactive with the binder resin and the monomer, and the dye compound including the epoxy group may be reactive with the binder resin, wherein the epoxy group is activated by heat.

In an exemplary embodiment, the dye compound including the epoxy group may include a base group which is substituted with the epoxy group, wherein the base group includes at least one selected from a xanthene, an anthraquinone, a perylene, a triphenyl methane, a porphyrazine, an azo, a styryl (2-methylpropyl benzene), a phthalocyanine, and an indigoid.

In another exemplary embodiment of a photoresist composition for forming a color filter, a photoresist composition includes a binder resin including a copolymerized repeating unit, wherein the copolymerized repeating unit includes a branch, wherein the branch includes an epoxy group; a monomer; a photo initiator; a dye compound, wherein the dye compound is reactive with the binder resin, and includes at least one functional group selected from a hydroxyl group, a carboxyl group, an amine group, and an isocyanate group; and an organic solvent.

In an exemplary embodiment, the photo composition may include about 5% to about 10% by weight of the binder resin, about 5% to about 10% by weight of the monomer, greater than 0% to less than about 1% by weight of the photo initiator, about 5% to about 10% by weight of the dye compound, each based on a total weight of the photoresist composition.

In an exemplary embodiment, the binder resin may be reactive with the monomer, the photo initiator may be activated by a light and is reactive with the binder resin and the monomer, and the dye compound comprising the at least one functional group may be reactive with the binder resin, wherein the epoxy group is activated by a heat.

In an exemplary embodiment, the dye compound include a base group substituted with the functional group, and the base group includes at least one selected from a xanthene, an anthraquinone, a perylene, a triphenyl methane, a porphyrazine, an azo, a styryl(2-methylpropyl benzene), a phthalocyanine and an indigoid.

In an exemplary embodiment, the amine group may include a primary amine group or a secondary amine group. The isocyanate group may be represented by following Chemical Formula A or Chemical Formula B.

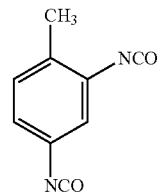

Chemical Formula A

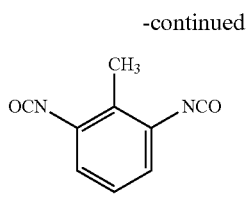

Chemical Formula B

In an exemplary embodiment, a method of manufacturing a color filter for a display device includes, disposing a photoresist composition for forming a color filter, wherein the photoresist composition includes a binder resin, a monomer, a photo initiator, a dye compound including an epoxy group and an organic solvent, on a base substrate; photo-curing the photoresist composition to provide a photo-cured photoresist composition; and thermo-curing the photo-cured photoresist composition to provide the color filter.

In another exemplary embodiment, a method of manufacturing a color filter for a display device includes disposing a photoresist composition for forming a color filter on a base substrate, the photoresist composition including a binder resin including a copolymerized repeating unit including a branch including an epoxy group, a monomer, a photo initiator, a dye compound including at least one functional group selected from a hydroxyl group, a carboxyl group, an amine group, and an isocyanate group, and an organic solvent; photo-curing the photoresist composition with light to provide a photo-cured photoresist composition; and thermo-curing the photo-cured photoresist composition to manufacture the color filter.

According to a method of manufacturing the color filter for a display device, the photo-curing the photoresist composition includes irradiating the photoresist composition disposed on the base substrate with a light, to activate the photo initiator and react the binder resin with the monomer to provide the photo-cured photoresist composition, and wherein the thermo-curing the photo-cured photoresist composition includes heat treating the photo-cured photoresist composition disposed on the base substrate, to react the at least one functional group of the dye compound with the binder resin to provide the color filter.

BRIEF DESCRIPTION OF THE DRAWINGS

The above and other features and advantages of this disclosure will become more apparent by describing in detail exemplary embodiments thereof, with reference to the accompanying drawings, in which.

DETAILED DESCRIPTION

Figure 1:
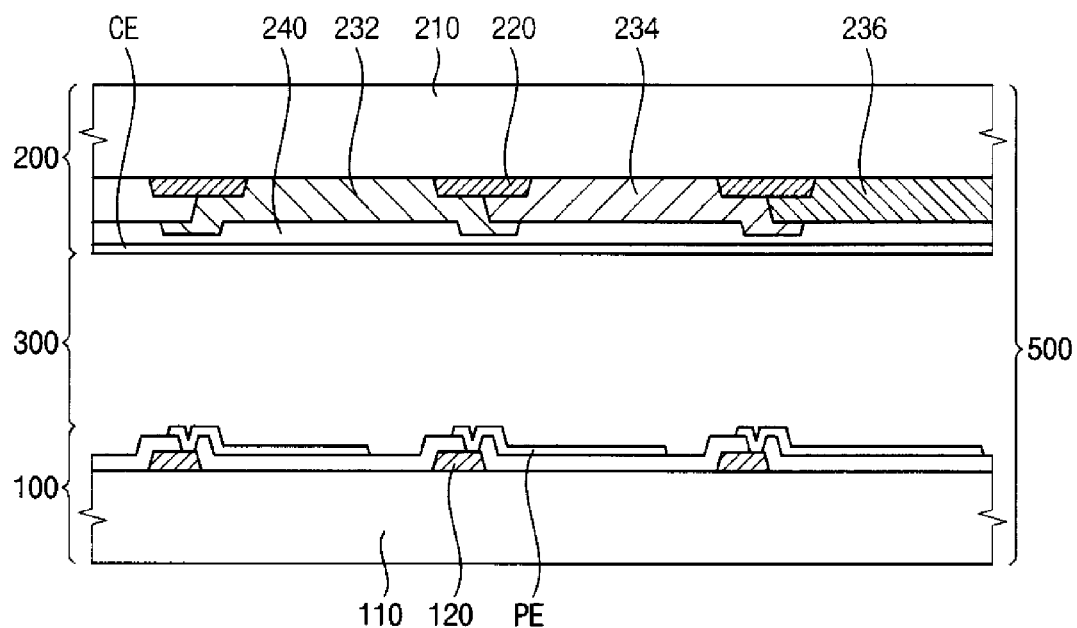
FIG. 1 is a cross sectional view illustrating an embodiment of a display device manufactured according to an exemplary embodiment.

Hereinafter, an embodiment of a photoresist composition is further disclosed with reference to the accompanying drawings. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. In the drawings, the thickness, size, and relative sizes of layers and regions may be exaggerated for clarity. Like reference numerals refer to like elements throughout.

The terminology used herein is for the purpose of describing particular embodiments only and is not intended to be limiting. As used here, the singular forms "a," "an," and "the" are intended to include the plural forms as well, including "at least one", unless the content clearly indicates otherwise. "Or" means "and/or." It will be further understood that the terms "comprises" and/or "comprising," or "includes" and/or "including" when used in this specification specify the presence of stated features, regions, integers, steps, operations, elements, and/or components but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning consistent with their meaning in the context of the relevant art, and will not be interpreted in an idealized or overly formal sense unless expressly so defined herein.

Embodiments are described herein with reference to cross sectional illustrations that are schematic illustrations of idealized embodiments (and intermediate structures). As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. A region illustrated as a rectangle may typically have rounded or curved features. Moreover, sharp angles that are illustrated may be rounded. Likewise, a buried region formed by implantation may result in some implantation in the region between the buried region and the surface through which the implantation takes place. Thus, the regions illustrated in the figures are schematic in nature and their shapes are not intended to illustrate the precise shape of a region and are not intended to limit the scope of the present disclosure.

It will be understood that when an element or layer is referred to as being "on", "connected to", or "coupled to" another element or layer, it can be directly on, connected to, or coupled to the other element or layer or intervening elements or layers may be present. When an element or layer is referred to as being "disposed on" or "formed on" another element or layer, the elements or layers are understood to be in at least partial contact with each other, unless otherwise specified. In contrast, when an element or layer is referred to as being "directly on", "directly connected to", or "directly coupled to" another element or layer, the elements are in at least partial contact with each other and there are no intervening elements or layers present. Like numerals refer to like elements or layers throughout. As used herein, the term "and/or" includes any and all combinations of one or more of the associated listed items.

It will be understood that, although the terms "first", "second", "third", and the like do not imply any particular order, but may be used herein to describe various elements, components, regions, layers and/or sections. These elements, components, regions, layers and/or sections should not be limited by these terms. These terms are only used to distinguish one element, component, region, layer and/or section. Thus a first element, component, region, layer and/or section discussed below could be termed a second element, component, region, layer and/or section without departing from the teachings herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the apparatus in use or operation in addition to the orientation depicted in the figures. For example, if the apparatus in the figures is turned over, elements described as "beneath", "below", or "lower" other elements or features would then be oriented "above", or "upper" the other elements or features. Thus, the exemplary term "below" can encompass both an orientation above and below. The apparatus may be otherwise oriented (rotated 90 degrees or at other orientations) and the spatially relative descriptors used herein interpreted accordingly.

The term "alkyl" refers to a straight or branched chain, saturated aliphatic hydrocarbon having the specified number of carbon atoms, for example a C1 to C30 alkyl group, and specifically a C1 to C15 alkyl group.

The term "alkoxy" group" refers to an alkyl group as defined herein, having the specified number of carbon atoms, for example a C1 to C30 alkoxy group, and specifically a C1 to C18 alkoxy group, linked via an oxygen, e.g. alkyl-O—.

The term "aryl" group refers to a cyclic group in which all ring members are carbon and at least one ring is aromatic, the group having the specified number of carbon atoms, for example a C6 to C30 aryl group, and specifically a C6 to C18 aryl group, and having a valence of at least one, optionally substituted with one or more substituents where indicated, provided that the valence of the aryl group is not exceeded. More than one ring may be present, and any additional rings may be independently aromatic, saturated or partially unsaturated, and may be fused, pendant, spirocyclic, or a combination thereof.

The term "ester" group" refers to a —C(=O)OR group, or —OC(=O)R group wherein R is an aliphatic group as defined below, having the specified number of carbon atoms, for example a C2 to C30 ester group, and specifically a C2 to C18 ester group, wherein the carbon of the carbonyl group is included in the specified number of carbon atoms.

The term "ketone" group" refers to a —C(=O)R group, wherein R is an aliphatic group as defined below, having the specified number of carbon atoms, for example a C2 to C30 ketone group, and specifically a C2 to C18 ketone group, wherein the carbon of the carbonyl group is included in the specified number of carbon atoms.

The term "(meth)acrylate" refers to an acrylate group ($H_2C=CH-C(=O)O-$) or a methacrylate group ($H_2C=C(CH_3)-C(=O)-$), and (meth)acryloxy refers to an acryloxy group and a methacryloxy group.

The term "*" represents a point of attachment of the indicated substituent.

The term "combination thereof" refers to a combination comprising at least one of the named constituents, components, compounds, or elements, optionally together with one or more of the same class of constituents, components, compounds, or elements not named.

The term "copolymerized" means random copolymerization, block copolymerization, or graft copolymerization, and the like, and the terms "polymer" and "copolymer" include a random copolymer, block copolymer, or graft copolymer, and the like.

Photoresist Composition for Forming a Color Filter-1

A photoresist composition for forming a color filter according to an exemplary embodiment includes a binder resin, a monomer, a photo initiator, a dye compound including an epoxy group, and an organic solvent. A color of a color filter formed by the photoresist composition may be substantially determined by a color of the dye compound.

The binder resin is a component of the photoresist composition for forming the color filter. While not wanting to be bound by theory, the binder resin is understood to stabilize the dispersion of the photoresist composition and facilitate the development of the photoresist composition. For example, during an exposure process, such as a photo-curing process, light is irradiated onto the photoresist composition disposed on a substrate, and a mask may be disposed on a film of the photoresist composition. The mask includes a light-blocking portion and a transmitting portion, and the transmitting portion may be disposed on an area which faces a first color filter. A portion of the photoresist composition disposed on an area which faces the light-blocking portion may be removed by a developing solution during a developing process, because the light does not irradiate this portion of the photoresist composition and thus polymerization and a cross-linking reaction does not occur between the binder resin and the monomer in this portion. Thus the unexposed binder resin may be removed from the substrate by the developing solution. In a portion of the photoresist composition disposed on an area which faces the transmitting portion, the photo-initiator is activated, and the binder resin may chemically react with the monomer, e.g., a polymerization and a cross-linking reaction may occur between the binder resin and the monomer. Thus, the developing solution does not substantially penetrate a surface of the photoresist composition disposed on an area facing the transmitting portion so that the binder resin and the monomer are not dissolved, so that the exposed photoresist composition remains disposed on an area facing the transmitting portion. Thus, the photoresist composition may be developed.

Examples of the binder resin may include a (meth)acrylate, an alkyl(meth)acrylate such as methyl(meth)acrylate, ethyl (meth)acrylate, propyl(meth)acrylate, butyl(meth)acrylate, isobutyl(meth)acrylate, tertiary-butyl(meth)acrylate, hexyl (meth)acrylate, octyl(meth)acrylate, lauryl(meth)acrylate, and stearyl(meth)acrylate, an aryl(meth)acrylate such as phenyl(meth)acrylate, an alcohol(meth)acrylate such as 2-hydroxy-ethyl(meth)acrylate, 2-hydroxypropyl(meth)acrylate, and glycerol(meth)acrylate, an alkyl aryl(meth)acrylate, succinic(meth)acrylate, a (meth)acrylate based resin, and the like. These may be used alone or a combination thereof.

An amount of the binder resin may be about 5% by weight to about 10% by weight, specifically about 6% by weight to about 9% by weight, based on a total weight of the photoresist composition. When an amount of the binder resin is more than about 5% by weight and less than about 10% by weight based on the total weight of the photoresist composition, the photoresist composition may be easily formed as a coating film disposed on the substrate. Furthermore, the dispersion of the photoresist composition may be stabilized.

The monomer may be cross-linked with the binder resin thereby improving the stabilization of the color filter by polymerization. The monomer may include a multifunctional monomer which has at least two hydroxyl groups.

Examples of the monomer may include glycerol(meth) acrylate, pentaerythritol hexa(meth)acrylate, ethyleneglycoldi(meth)acrylate, triethyleneglycoldi(meth)acrylate, 1,4-butandioldi(meth)acrylate, 1,6-hexandioldi(meth)acrylate, neopentylglycoldi(meth)acrylate, pentaerythritol di(meth)acrylate, pentaerythritol tri(meth)acrylate, dipentaerythritol-tri(meth)acrylate, dipentaerythritol(meth)acrylate, bisphenol A di(meth)acrylate, trimethylpropane tri(meth)acrylate, novolac epoxy(meth)acrylate, diethyleneglycoldi(meth)acrylate, propyleneglycoldi(meth)acrylate or the like. These may be used alone or a combination thereof.

An amount of the monomer may be about 5% by weight to about 10% by weight, specifically about 6% by weight to about 9% by weight, based on a total weight of the photoresist composition. When an amount of the monomer is more than about 5% by weight to less than about 10% by weight based on the total weight of the photoresist composition, the color filter may be stably formed without reducing the dispersion, the coating ability and the adhesion of the photoresist composition.

The photo initiator may initiate a reaction, for example a polymerization reaction, between the binder resin and the monomer in forming the color filter. For example, when the photoresist composition is irradiated with light, the photo initiator is activated by the light. The activated photo initiator may initiate the polymerization reaction between the binder resin and the monomer included in the photoresist composition. That is, the photoresist composition may have photosensitivity, due to the photo initiator included in the photoresist composition.

Examples of the photo initiator may include an acetophenone-based compound, a benzophenone-based compound, a thioxanthone-based compound, a benzoin-based compound, a triazine-based compound, an oxime-based compound and the like. These may be used alone or in a combination thereof.

Examples of the acetophenone-based compound may include 2,2'-diethocyacetophenone, 2,2'-dibutoxyacetophenone, 2-hydroxyl-2-methylfluorophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, and 2-benzyl-2-dimethylamino-1-(4-morpholinophenyl)-butan-1-one. These may be used alone or in a combination thereof.

The benzophenone-based compound may include benzophenone, benzoyl benzoate, methyl benzoylbenzoate, 4-phenyl benzophenone, hydroxy benzophenone, acrylate benzophenone, 4,4'-bis(diethylamino)benzophenone, 4,4'-dimethylaminobenzophenone, 4,4'dichlorobenzophenone, 3,3'-dimethyl-2-methoxy benzophenone and the like. These may be used alone or in a combination thereof.

The thioxanthone-containing compound may include thioxanthone, 2-methylthioxanthone, isopropyl thioxanthone, 2,4-diethyl thioxanthone, 2,4-diisopropyl thioxanthone, 2-chrolothioxanthone, or the like. These may be used alone or in a combination thereof.

The benzoin-based compound may include benzoin, benzoin methyl ether, benzoin ethyl ether, benzoin isopropyl ether, benzoin isobutyl ether, benzyldimethylketal and the like. These may be used alone or in a combination thereof.

The triazine-based compound may include, 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphthol-yl)-4,6-bis(trichloromethyl)-s-triazine, 2-(4-methoxynaphtho1-yl)-4,6-bis(trichloromethyl)-s-triazine, 2-4-trichloromethyl (piperonyl)-6-triazine, 2-4-trichloromethyl(4'-methoxystyryl)-6-triazine, 2-piperoniro-4,6-bis(trichloromethyl)-1,3,5-triazine, and the like. These may be used alone or in a combination thereof.

The oxime-based compound may include 2-(o-benzoyloxime)-1-[4-(phenylthio)phenyl]-1,2-octanedione, 1-(o-acetyloxime)-1-[9-ethyl-6-(2-methylbenzoyl-9H-carbazole-3-yl)ethanone, and the like. These may be used alone or in a combination thereof.

Alternatively, a carbazole-based compound, a diketone-based compound, a sulfonium borate-based compound, a diazo-based compound and the like may be used as the photo initiator. These may be used alone or in a combination thereof.

An amount of the photoinitiator may be greater than about 0% by weight and less than about 1% by weight, specifically about 0.01% by weight to about 0.9% by weight, based on a total weight of the photoresist composition. When an amount of the photo initiator is greater than 0% by weight and less than about 1% by weight, based on a total weight of the photoresist composition, the photoresist composition may be photosensitive, and the photo initiator may effectively control the reaction speed when exposed to a light during an exposure process, such as a photo-curing process.

In an embodiment, the dye compound includes an epoxy group. During a heat-treatment process, such as a thermo-curing process, after the exposure process, the photo-cured photoresist composition disposed on a substrate is exposed to a heat and the dye compound reacts with the binder resin so that the dye compound is combined with the binder resin, to provide a thermo-cured product. For example, the dye compound may be combined with a product from the exposure process, such as a cured product from photo-curing of the monomer and the binder resin, such as a photo-cured photoresist composition, or combined during a heat-treatment process, such as a thermo-curing process, to provide a thermo-cured product. While not wanting to be bound by theory, it is understood that an epoxy group of the dye compound is ring-opened by a heat, and the ring-opened epoxy group is combined with the binder resin. Thus, the binder resin may be cross-linked with the dye compound to provide a thermo-cured product such as a thermo-cured photoresist composition, so that the thermo-cured photoresist composition may be disposed in a thin film including the binder resin. Thus, in a heat-treatment process, the migration of the dye compound to the surface of the thin film including the binder resin may be prevented or reduced and the dye compound may remain in the thin film.

When the dye compound does not include an epoxy group, and when the organic solvent contained in the photoresist composition disposed on the substrate is volatilized, the dye compound, which is disposed adjacent to the surface of the thin film including the binder resin, and which does not include an epoxy group, may be damaged by a heat or an oxygen radical in a heat-treatment process. When the dye compound, which does not include an epoxy group, is damaged, a color represented by a color filter which is formed by the photoresist composition may be discolored and the color filter may be decolorized.

However, when the dye compound includes an epoxy group, the dye compound may be cross-linked with the binder resin. Thus, the dye compound may be included in the network formed by the dye compound and the binder resin. Thus, contact of the dye compound with heat or an oxygen radical is minimized, even if the organic solvent is volatilized. Thus, while not being bound by theory, it is believed that the color reproducibility and the transmittance of the color filter, which is formed by the photoresist composition, is improved by combining of the dye compound with the binder resin.

The dye compound including the epoxy group includes a base group substituted with the epoxy group. As used herein, "substituted with an epoxy group" means that a hydrogen of the base group is replaced with the epoxy group. Examples of the base group substituted with the epoxy group may include at least one selected from a xanthene, an anthraquinone, a perylene, a triphenyl methane, a porphyrazine, an azo-based compound, a stryryl(2-methylpropyl benzene), a phthalocyanine, an indigoid, and the like. For example, the dye compound may include a xanthene-based dye, an anthraquinone-based dye, a perylene-based dye, a triphenyl methane-based dye, a porphyrazine-based dye, an azo-based dye, a styryl-based dye, a phthalocyanine-based dye, indigoid-based dye and the like, in which a hydrogen atom is substituted with an epoxy group. The dye compound may be selected based on the desired color of the color filter which is formed by the photoresist composition.

The azo-based dye may include at least one selected from an azo-pyridone base group represented by the following Chemical Formula 1, azo-pyridine base group represented by the following Chemical Formula 2, and a base group compound represented by the following Chemical Formula 3.

Chemical Formula 1

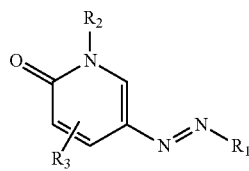

Chemical Formula 2

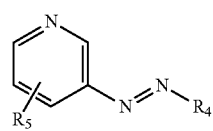

Chemical Formula 3

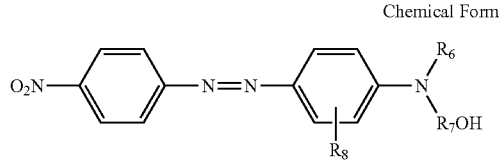

In Chemical Formulas 1, 2 and 3, each of $R_1$, $R_2$, $R_3$, $R_4$, $R_5$, $R_6$, $R_7$ and $R_8$ are each independently a hydrogen, or an alkyl group, for example a $C_1$ to $C_{10}$ alkyl group. When the dye compound is an azo-based dye compound, the dye compound may include a base group of at least one selected from Chemical Formulas 1, 2 and 3. In the dye compound, a hydrogen bound to a carbon of the base group is substituted with an epoxy group.

For example, the anthraquinone-based dye may include a base group represented by the following Chemical Formula 4. For example, when the dye compound is the anthraquinone-based dye, the dye compound may include a base group represented by Chemical Formula 4. In the dye compound, a hydrogen atom of the base group is substituted with an epoxy group.

Chemical Formula 4

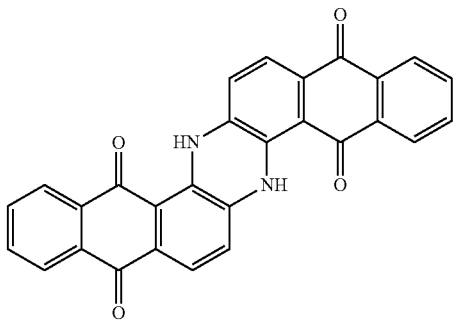

For example, the indigoid-based dye may include a base group which is represented by the following Chemical Formula 5. For example, when the dye compound is the indigoid-based dye, the dye compound may include a base group represented by Chemical Formula 5. In the dye compound, a hydrogen bound to carbon of the base group is substituted with an epoxy group.

Chemical Formula 5

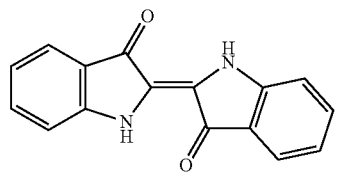

For example, the phthalocyanine-based dye may include a base group which is represented by the following Chemical Formula 6, Chemical Formula 7-1, Chemical Formula 7-2 and Chemical Formula 8. When the dye compound is the phthalocyanine-based dye, the dye compound may include a base group represented by at least one selected from Chemical Formula 6, Chemical Formula 7-1, Chemical Formula 7-2 and Chemical Formula 8. In the dye compound, a hydrogen bound to a carbon of the base group is substituted with an epoxy group.

Chemical Formula 6

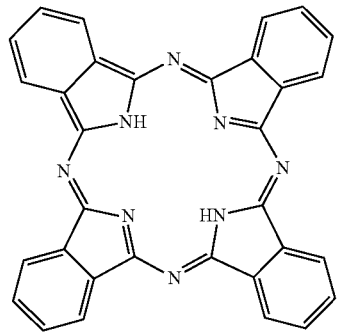

In Chemical Formula 6, at least one of the hydrogen atoms of the four benzene rings may be substituted with an alkoxy group, e.g., a $C_1$ to $C_{10}$ alkoxy group, or a $C_1$ to $C_{10}$ alkyl group. An embodiment in which the alkyl group is a tert-butyl group is specifically mentioned.

Chemical Formula 7-1

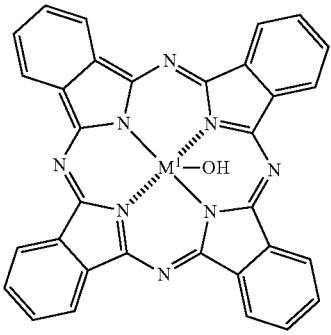

Chemical Formula 7-2

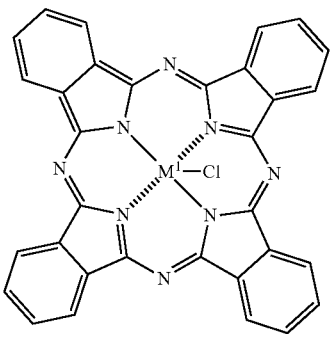

In each of Chemical Formula 7-1 and 7-2, at least one of the hydrogen atoms of the four benzene rings may be substituted with

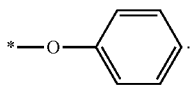

In Chemical Formula 7-1 and 7-2, $M^1$ is a Group 13 element of the Periodic Table. $M^1$ may be at least one selected from boron ("B"), aluminum ("Al"), gallium ("Ga"), indium ("In"), and thallium ("Tl").

Chemical Formula 8

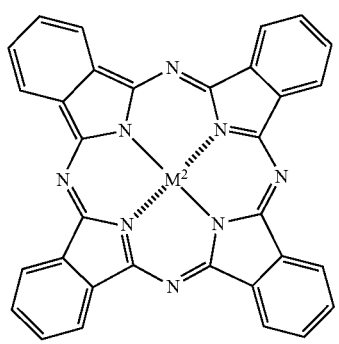

In Chemical Formula 8, "$M^2$" represents a transition metal, and at least one of the hydrogen atoms of the four benzene rings may be substituted with a $C_1$ to $C_{10}$ alkoxy group, a $C_1$ to $C_{10}$ alkyl group, $-NO_2$ or

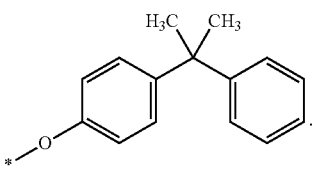 [SMILES: *Oc1ccc(C(C)(C)c2ccccc2)cc1]

The transition metal, for example, may include a Group 9 to Group 12 element of the Periodic Table, and may be at least one selected from copper ("Cu"), zinc ("Zn"), lead ("Pb"), cadmium ("Cd"), cobalt ("Co"), and nickel ("Ni").

By introducing an epoxy group to the above exemplified base group, the dye compound including the base group may be cross-linked with the binder resin during a heat-treatment process.

As is further disclosed above, the dye compound may be included in an amount of about 5% by weight to about 10% by weight, specifically about 6% by weight to about 9% by weight, based on a total weight of the photoresist composition. When an amount of the dye compound is more than about 5% by weight to less than about 10% by weight based on the total weight of the photoresist composition, the color reproducibility of the color filter formed by the photoresist composition may be improved.

In an embodiment, the organic solvent is included such that a total weight of the organic solvent, the binder resin, the monomer, the photo initiator and the dye compound is about 100% by weight, based on the total weight of the photoresist composition. Thus in an embodiment, the organic solvent corresponds to a remainder of the photoresist composition, and the contents of the organic solvent may be determined by subtracting the content of the binder resin, the monomer, the photo initiator, and the dye compound from a total weight of the photoresist composition.

Examples of the organic solvent may include an alcohol such as methanol and ethanol, an ether such as dichloroethyl ether, n-butyl ether, diisoamyl ether, methylphenyl ether, and tetrahydrofuran, a glycol ether such as ethylene glycol monomethylether and ethylene glycol monoethylether, an ethylene glycol alkyl ether acetate such as methyl cellosolve acetate and ethyl cellosolve acetate, a propylene glycol alkyl ether acetate such as propylene glycol methyl ether acetate, propylene glycol ethyl ether acetate, propylene glycol propyl ether acetate and propylene glycol butyl ether acetate, a propylene glycol alkyl ether propionate such as propylene glycol methyl ether propionate, propylene glycol ethyl ether propionate, propylene glycol propyl ether propionate and propylene glycol butyl ether propionate, an aromatic compound such as toluene and xylene, a ketone such as methyl ethyl ketone, cyclohexanone and 4-hydroxyl-4-methyl-2-pentanone, and an ester compound such as methyl acetate, ethyl acetate, propyl acetate, butyl acetate, ethyl 2-hydroxylpropionate, methyl 2-hydroxyl-2-methyl propionate, ethyl 2-hydroxyl-2-methyl propionate, methyl hydroxylacetate, ethyl hydroxylacetate, butyl hydroxylacetate, methyl lactate, ethyl lactate, propyl lactate sulfate, butyl lactate, methyl 3-hydroxylpropionate, ethyl 3-hydroxylpropionate, propyl 3-hydroxylpropionate, butyl 3-hydroxylpropionate, methyl 2-hydroxyl-3-methyl butanoate, methyl methoxy acetate, ethyl methoxy acetate, propyl methoxy acetate, butyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate and the like. The foregoing organic solvents can each be used alone or in a combination thereof.

The composition for forming a color filter may further include, in addition to the binder resin, the monomer, the photo initiator, the dye compound and the organic solvent, an additional agent for preventing or reducing the creation of spots during a coating process, for effective leveling control, or for preventing or reducing the creation of residue by an undeveloped area. Examples of the additional agent may include a malonic acid, a 3-amino-1,2-propanediol, a silane-based coupling agent including a vinyl group or a (meth)acryloxyl group, a fluorine-based surfactant, an epoxy resin, and the like. The additional agent can be used alone or in a combination thereof.

Also, the composition for forming a color filter may further include a pigment which represents a color.

The dye compound may be easily cross-linked with the binder resin during a heat-treatment process, such as a thermo-curing process, when the dye compound includes an epoxy group. Thus, while not wanting to be bound by theory, it is believed that the dye compound may remain and be disposed in a color filter that the photoresist composition forms, so that the dye compound is prevented or reduced from being damaged by an external factor.

Photoresist Composition for Forming a Color Filter-2

A photoresist composition for forming a color filter according to another exemplary embodiment includes a binder resin including a copolymerized repeating unit including a branch including an epoxy group, a monomer, a photo initiator, a dye compound including a functional group which is reactive with the binder resin and an organic solvent. In the photoresist composition, the monomer, the photo initiator and the organic solvent are each substantially identical with the photoresist composition disclosed above, including the monomer, the photo initiator and the organic solvent, for forming a color filter as disclosed above, and thus any repetitive detailed explanation concerning the above elements will be omitted for clarity. Also, in the photoresist composition comprising the binder resin including an epoxy group, a content of each ingredient is substantially identical with that described above in the photoresist composition comprising a dye compound comprising an epoxy group, and thus repetitive detailed explanation concerning the above elements will be omitted for clarity.

The binder resin may be a polymer of a monomer including, at least two different functional groups. For example, the binder resin may include an acryl-based polymer. The copolymerized repeating unit of the binder resin may include an epoxy group, and the epoxy group may be on a branch (e.g., side chain) of the polymer. For example, the binder resin may include a copolymerized repeating unit represented by following Chemical Formula 9.

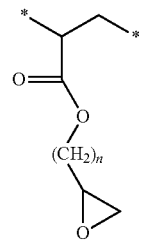

Chemical Formula 9

In Chemical Formula 9, "n" represents a whole number from 1 to 5, and "*" represents a point of attachment to a subsequent repeating unit.

The binder resin may be substantially the same as a binder resin which is suitable for use as a photoresist composition except for including the copolymerized repeating unit including the epoxy group.

The functional group of the dye compound including the at least one functional group may include a hydroxyl group (—OH), a carboxyl group (—C(═O)OH), an amine-based group, or an isocyanate group. The functional group of the dye compound may be combined with the binder resin, so that the dye compound may represent a color of a color filter, which is formed by the photoresist composition, and the dye compound may function as a cross-linking agent of the binder resin. In a heat-treatment process, such as a thermo-curing process, which is performed after a developing of the exposed photoresist composition, during an exposure process, such as a photo-curing process, the at least one functional group of the dye compound reacts with an epoxy group of the binder resin, so that the dye compound may be cross-linked with the binder resin. Thus, the dye compound may be disposed in the network formed by the binder resin and the dye compound. Thus, contact of the dye compound, which is disposed in the polymerization product formed by the binder resin and the dye compound, with heat or an oxygen radical is minimized, even if the organic solvent is volatilized.

The amine-based functional group may include a primary amine group or a secondary amine group.

The isocyanate group may be represented by following Chemical Formula A or Chemical Formula B.

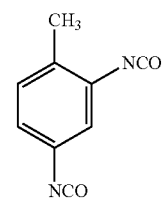

Chemical Formula A

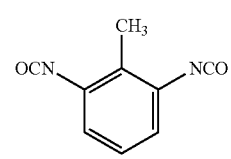

Chemical Formula B

Alternatively, in the dye compound, the base group may be at least one functional group selected from a xanthene, an anthraquinone, a perylene, a triphenyl methane, a porphyrazine, an azo-based compound, a styryl(2-methylpropyl benzene), a phthalocyanine, an indigoid, and the like. For example, the dye compound may include at least one selected from a xanthene-based dye, an anthraquinone-based dye, a perylene-based dye, a triphenyl methane-based dye, a porphyrazine-based dye, an azo-based dye, a styryl-based dye, a phthalocyanine-based dye, an indigoid-based dye and the like, in which a hydrogen bound to carbon is substituted with at least one selected from a hydroxyl group (—OH), a carboxyl group (—C(=O)OH), an amine-based group, and an isocyanate group. In an embodiment of the photoresist composition, the dye compound may include at least two different functional groups.

Accordingly, a copolymerized repeating unit of the binder resin includes an epoxy group, the epoxy group may be on a branch (e.g., a side chain), and the dye compound may include at least one functional group which may be cross-linked with the binder resin. Thus, the binder resin may easily be cross-linked with the dye compound during a heat-treatment process, such as a thermo-curing process. Thus, while not wishing to be bound by theory it is believed the dye compound may remain and be disposed in a color filter that is formed from the photoresist composition, so that the dye compound is prevented or reduced from being damaged, e.g., by an external factor such as contact with an oxygen radical or air, for example.

Hereinafter, a display device including a color filter manufactured using a photoresist composition for forming a color filter according to an exemplary embodiment will be further described with reference to the accompanying drawings, and then a process of forming the color filter will be further described.

Method of Manufacturing a Display Device and a Display Substrate for a Display Device FIG. 1 is a cross-sectional view illustrating an embodiment of a display device manufactured according to an exemplary embodiment.

Referring to FIG. 1, a display device 500 includes a first substrate 100, a second substrate 200 and a liquid crystal layer 300. The second substrate 200 may face the first substrate 100, and the liquid crystal layer 300 may be interposed between the first and second substrates 100 and 200. A light passes through the first substrate 100, the liquid crystal layer 300, and the second substrate 200, sequentially, and liquid crystal molecules of the liquid crystal layer 300 control the transmittance of the light, so that the display device 500 may display an image. The display device 500 may display a color image by color filters 232, 234 and 236 disposed on the second base substrate 210.

The first substrate 100 includes a switching element 120 disposed on a first base substrate 110 and a pixel electrode, denoted as PE in FIG. 1, electrically connected with the switching element 120. Each of pixels of the display device 500 includes the switching element 120 and the pixel electrode PE. The switching element 120 includes a control electrode (not illustrated) electrically connected with a signal wiring, which is disposed on the base substrate 110, an input electrode, and an output electrode (not illustrated), wherein the output electrode may be electrically connected with the pixel electrode PE.

The second substrate 200 includes a light-blocking pattern 220 disposed on a second base substrate 210 which faces the first base substrate 110, the color filters 232, 234 and 236, an overcoating layer 240 and a common electrode, denoted as CE in FIG. 1, wherein the overcoating layer is in contact with the common electrode.

The light-blocking pattern 220 may be disposed on the second base substrate 210 to face an area, in which the switching element 120 and the signal wirings are disposed, of the first substrate 100.

The color filters 232, 234 and 236 are disposed on the second base substrate 210 to face an area that the pixel electrode is disposed on. The color filters 232, 234 and 236 may include a first color filter 232, a second color filter 234 and a third color filter 236 which represent different colors. For example, the first color filter 232 may represent red, the second color filter 234 may represent green, and the third color filter 235 may represent blue. Each of the first to third color filters 232, 234 and 236 include a dye compound, the dye compound is cross-linked with a binder resin and represents a color. The binder resin and the dye compound will be further described in the manufacturing process of the first to third color filters 232, 234 and 236.

The common electrode CE is disposed on the overcoating layer 240. The overcoating layer 240 may be omitted, and the common electrode CE may be disposed directly on the first to third color filters 232, 234 and 236.

Hereinafter, referring to FIG. 1 and FIG. 2, a process of forming the first to third color filters 232, 234 and 236 of the second substrate 200, will be further described.

Figure 2:
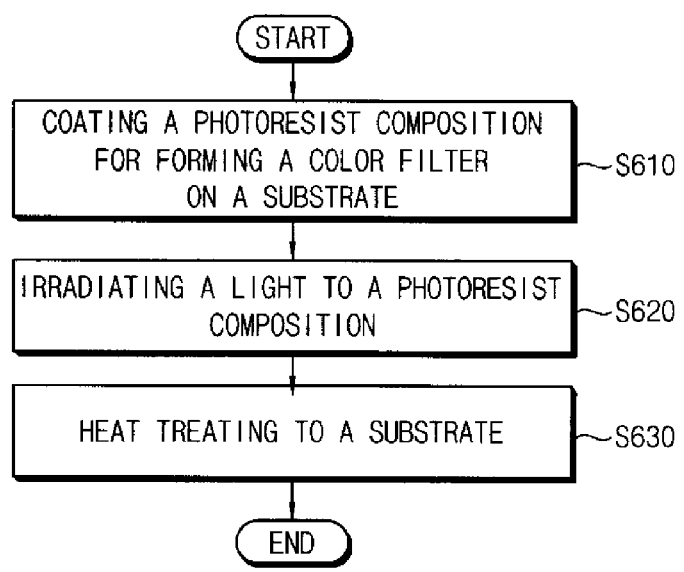
FIG. 2 is a flowchart illustrating an embodiment of a process of manufacturing the color filter illustrated in FIG. 1.

FIG. 2 is a flowchart illustrating an embodiment of a process of manufacturing the color filter illustrated in FIG. 1.

Referring to FIG. 1 and FIG. 2, the light-blocking pattern 220 is disposed on the second base substrate 210. A light-blocking film, for example a chrome film, is disposed on the second base substrate 210, and the light-blocking pattern 220 may be formed by patterning the light-blocking film using a photolithography process. The light-blocking pattern 220 may be formed by using an ink jetting method. In the ink jetting method, an organic material is jetted partially on the second base substrate 210.

Thereafter, a photoresist composition for forming a color filter is coated e.g., disposed on a base substrate, e.g., the second base substrate 210 that the light-blocking pattern 220 is disposed on (denoted as Step S610 in FIG. 2).

The photoresist composition for forming a color filter includes a binder resin, a monomer, a photo-initiator, a dye compound and an organic solvent. The dye compound includes an epoxy group as a functional group. The photoresist composition for forming a color filter is substantially identical with the previously described photoresist composition according to an exemplary embodiment, so that any repetitive detailed explanation will be omitted.

For example, when the first to third color filters 232, 234 and 236 are disposed sequentially, a photoresist composition for forming the first color filter 232 which represents red may include an anthraquinone-based dye compound including an epoxy group as a functional group and/or a xanthene-based dye compound including an epoxy group as a functional group. The photoresist composition may further include a dye compound or a pigment, which represents a yellow so that the color reproducibility of a red represented by the first color filter 232 may be improved. Furthermore, the dye compound representing a yellow may include an epoxy group as a functional group. For example, examples of the dye compound representing a yellow may include an azo-pyridine-based dye compound and/or a styryl-based dye compound, each of which may include an epoxy functional group.

A light is irradiated onto the photoresist composition disposed e.g., coated on a base substrate, e.g., the second base substrate 210 (denoted as Step S620 in FIG. 2), during an exposure process, such as a photo-curing process, to activate the photo initiator and react the binder resin with the monomer, to provide the photo-cured photoresist composition.

In detail, during an exposure process, such as a photo-curing process, light is irradiated onto the photoresist composition, disposed on the base substrate, and a mask (not illustrated) may be disposed on a coating film of the photoresist composition. The mask includes a light-blocking portion and a transmitting portion, and the transmitting portion may be disposed on an area which faces the first color filter 232. A portion or region of the photoresist composition disposed on an area which faces the light-blocking portion is removed by a developing solution during a developing process. In a portion or region of the photoresist composition disposed on an area which faces the transmitting portion, the photo-initiator is activated, so that the binder resin may chemically react with the monomer. Thus, the developing solution does not substantially penetrate a surface of the photoresist composition disposed on an area facing the transmitting portion, so that the exposed photoresist composition remains disposed on the area facing the transmitting portion, to provide a photo-cured photoresist composition. Thus, the first color filter 232 may be preliminarily formed.

Thereafter, the second base substrate 210, including the photo-cured photoresist composition, which is exposed and developed during a photo-curing process, is heat treated (denoted as Step S630 in FIG. 2), such as in a thermo-curing process to react the epoxy functional group of the dye compound with the binder resin, to provide the color filter.

Heat is applied to the second base substrate 210, so that the binder resin may be cross-linked with the dye compound. During a heat-treatment process, the first color filter 232 illustrated in FIG. 1 may be finally formed by volatilizing the organic solvent of the photoresist composition, when the binder resin is cross-linked with the dye compound. The dye compound combines with the binder resin during a heat-treatment process, such as a thermo-curing process, so that the dye compound is easily disposed on the first color filter 232 adjacent to a surface of the color filter 232. Thus, the percentage or amount of the dye compound exposed to a heat or an oxygen radical may be minimized, so that chemical change, for example, decomposition of the dye compound may be minimized.

The second color filter 234 and the third color filter 236 may be formed by a process which is substantially identical to the process of forming the first color filter 232. For example, a photoresist composition for forming the second color filter 234 is disposed e.g., coated on the second base substrate 210 that the first color filter 232 is disposed on. After an exposure process and a developing process for the second base substrate 210, the second base substrate 210 is treated by a heat-treatment process, to provide the second color filter 234.

A photoresist composition for forming the second color filter 234 which represents a green may include a triphenyl methane-based dye compound which includes an epoxy group, and the photoresist composition may further include the dye compound representing a yellow or a violet. A photoresist composition for forming the second color filter 234 is substantially identical to a photoresist composition for forming the first color filter 232 except for the color represented by the dye compound. Thus, any repetitive explanation concerning the above elements will be omitted.

Also, a photoresist composition for forming the third color filter 236 which represents a blue may include a blue-representing dye compound which includes an epoxy group, and a triphenyl methane-based dye compound which includes an epoxy group and a dye compound which represents a yellow or a violet.

After forming the first to third color filters 232, 234 and 236, the overcoating layer 240 and the common electrode CE are disposed on the second base substrate, sequentially, to provide the second substrate 200 illustrated in FIG. 1.

Accordingly, when the first to third color filters 232, 234 and 236 of the second substrate are formed, the dye compound includes an epoxy group which may react with the binder resin by a heat-treatment process such as a thermo-curing process, so that the thermal resistance and the manufacturing reliability of the color filter is improved and reduction in the color reproducibility may be prevented or substantially reduced.

Figure 3:
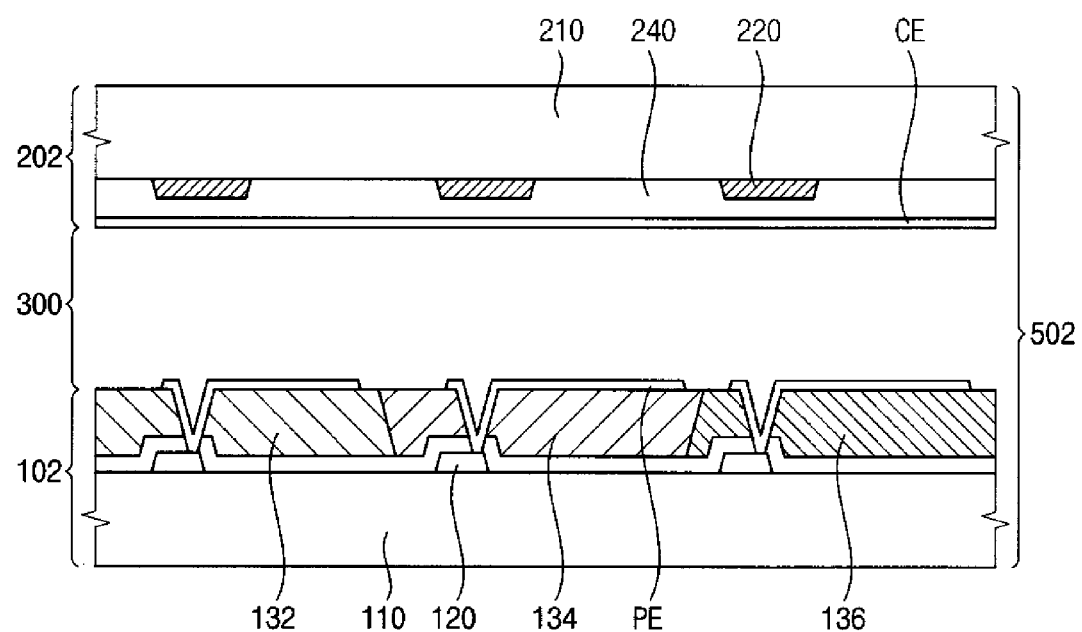
FIG. 3 is a cross sectional view illustrating an embodiment of a display device manufactured according to another exemplary embodiment.

FIG. 3 is a cross-sectional view of an embodiment of a display device manufactured according to another exemplary embodiment.

Referring to FIG. 3, a display device 502 includes a first substrate 102, a second substrate 202 and a liquid crystal layer 300.

The first substrate 102 includes a switching element 120 disposed on the first base substrate 110, color filters 132, 134 and 136 and a pixel electrode, denoted as PE in FIG. 3. The first substrate 102 is substantially identical to a first substrate 100 illustrated in FIG. 1 except that the first substrate 102 further includes the color filters 132, 134 and 136. Thus, any repetitive explanation concerning the above elements will be omitted.

The color filters 132, 134 and 136 include a first color filter 132, a second color filter 134 and a third color filter 136. For example, the first color filter 132 may represent a red, the second color filter 134 may represent a green and the third color filter 136 may represent a blue. The first to third color filters 132, 134 and 136 are substantially identical to a first to third color filters 232, 234 and 236 of the second substrate 200 illustrated in FIG. 1 except that the first to third color filters 132, 134 and 136 are disposed on the first base substrate 110. Thus, any repetitive explanation concerning the above elements will be omitted.

The second substrate 202 includes a common electrode, denoted as CE in FIG. 3, disposed on a second base substrate 210 which is facing the first base substrate 110. The second substrate 202 may further include a light-blocking pattern 220, disposed between the second substrate 202 and the second base substrate 210, and/or an overcoating layer 240, wherein the overcoating layer is in contact with the common electrode.

Hereinafter, a manufacturing process of a first substrate 102 illustrated in FIG. 3, will be further described referring to FIG. 2.

Referring to FIG. 3 and FIG. 2, the switching element is disposed on the first base substrate 110. During a process of forming the switching element, the signal wirings electrically connected with the switching element are also formed.

A photoresist composition for forming a color filter is disposed e.g., coated on the first base substrate 110 that the switching element 120 is formed on. The photoresist composition for forming a color filter includes a binder resin including a copolymerized repeating unit which includes a branch including an epoxy group, a monomer, a photo-initiator, a dye compound wherein the dye compound is reactive with the binder resin, and includes at least one functional group, and an organic solvent. The functional group includes at least one selected from a hydroxyl group (—OH), a carboxyl group (—C(=O)OH), an amine-based group, or an isocyanate group. The photoresist composition for forming color filter is substantially identical to a previously described photoresist composition according to another exemplary embodiment, so that any repetitive explanation concerning the above elements will be omitted.

For example, a photoresist composition for forming the first color filter 132 representing a red may include a dye compound, which is an anthraquinone-based dye compound substituted with a hydroxyl group (—OH), a carboxyl group (—C(=O)OH), an amine-based group, or an isocyanate group, and the binder resin, as well as the monomer, the photo initiator, and the organic solvent. The photoresist composition may further include a dye compound representing a yellow or a pigment representing a yellow. The color reproducibility of a red represented by the first color filter 132 may be optimized or improved by the dye compound representing a yellow or the pigment representing a yellow.

Thereafter, a light is irradiated onto the photoresist composition disposed e.g., coated on the base substrate 110. During an exposure process such as a photo-curing process of the photoresist composition, a light is irradiated onto the photoresist composition disposed on the base substrate, to activate the photo initiator and react the binder resin with the monomer, to provide the photo-cured photoresist composition. A mask including a light-blocking portion and a transmitting portion may be disposed on a coating film of the photoresist composition. In a portion or region of the photoresist composition disposed on an area facing the transmitting portion, the photo-initiator is activated, so that the binder polymer and the monomer may be chemically reacted.

After the exposure process, the first color filter 132 may be developed to provide the preliminarily formed first color filter 132. During a developing process, a portion or region of the photoresist composition disposed on an area facing the transmitting portion remains disposed on the first base substrate 110, and, a portion of the photoresist composition disposed on an area facing the light-blocking portion is removed from the first base substrate 110 by a developing solution, to provide a photo-cured photoresist composition.

Thereafter, the first base substrate 110 including the photo-cured photoresist composition, which was exposed and developed during a photo-curing process, is treated by a heat, such as a thermo-curing process to react the at least one functional group of the dye compound with the binder resin, to provide the color filter. By heat-treating the first base substrate 110, the binder resin may be cross-linked with the dye compound. For example, during a heat-treatment process, when the binder resin is cross-linked with the dye compound, the organic solvent of the photoresist composition is volatized, and the first color filter 132 illustrated in FIG. 3 may be finally formed. The dye compound combines with the binder resin during a heat-treatment process, such as a thermo-curing process, so that the dye compound is easily disposed on the first color filter 132 adjacent to the surface of the color filter 132. Thus, a percentage or amount of the dye compound exposed to heat or an oxygen radical may be minimized, so that chemical change, namely, decomposition of the dye compound may be minimized.

Using a process which is substantially identical to a forming process of the first color filter 132, the second color filter 134 and the third color filter 136 may be formed. The photoresist composition for forming each of the second and third color filters 134 and 136 also includes the binder resin and a dye compound including at least one functional group which is cross-linked with the binder resin. A dye compound of the photoresist composition for forming each of the second and third color filters 134 and 136 may be different from a dye compound of the photoresist composition for forming of the first color filter 132, so that a color represented by the second and third color filters 134 and 136 may be different than a color represented by the first color filter 132.

After forming the first to third color filters 132, 134 and 135, the pixel electrode is disposed on the first base substrate 110, to provide the first substrate 102 illustrated in FIG. 3.

Accordingly, when manufacturing the first to third color filters 132, 134 and 136 of the first substrate 102, the binder resin is cross-linked with the dye compound by a heat-treatment process such as a thermo-curing process. Thus, the thermal resistance and the manufacturing reliability of the color filters first to third 132, 134 and 136 respectively, may be improved and reduction in the color reproducibility may be prevented or minimized.

The first to third color filters 132, 134 and 136 as shown in FIG. 3 may be manufactured by a manufacturing process illustrated in FIG. 2, using a photoresist composition including a binder resin, and a dye compound, wherein the dye compound includes a copolymerized repeating unit including an epoxy group. A process of forming the first to third color filters 132, 134 and 136 respectively, is substantially identical to a process of forming the first to third color filters 232, 234, and 236 described above with reference to FIG. 1 and FIG. 2 except that the first to third color filters 132, 134 and 136 are disposed on the first base substrate 110, so that the first to third color filters 132, 134 and 136 may be manufactured by the substantially identical process. Thus, any repetitive explanation concerning the above element will be omitted.

However, the first to third color filters 232, 234 and 236 as shown in FIG. 1, may be manufactured by a manufacturing process illustrated in FIG. 2, using a photoresist composition including a binder resin, including a copolymerized repeating unit including an epoxy group, and a dye compound including a functional group, wherein the functional group may be cross-linked by a heat-treatment process, such as a thermo-curing process. A process forming the first to third color filters 232, 234 and 236 is substantially identical to a process which of forming the first to third color filters 132, 134, and 136 described above with reference to FIG. 2 and FIG. 3 except that the first to third color filters 232, 234 and 236 are formed on the second base substrate 210, so that the first to third color filters 232, 235 and 236 may be manufactured by the substantially identical process. Thus, any repetitive explanation concerning the above element will be omitted.

As described above, in a heat-treatment process such as a thermo-curing process following a photo-curable process of the photoresist composition for forming a color filter, a binder resin is cross-linked with a dye compound. By such cross-linking, migration of the dye compound adjacent to the surface of the thin film formed by the binder resin is prevented or reduced and the dye compound may remain in the thin film after a heat-treatment process. Thus, decomposition of the dye compound by a heat or oxygen radical is prevented, so that the color reproducibility and the transmittance of the color filter is improved.

The foregoing is illustrative of the present disclosure and shall not be construed as limiting thereof. Although embodiments have been described, those skilled in the art will readily appreciate that various changes and modifications can be made by one of ordinary skill in the art without departing from the novel teachings and advantages of disclosed embodiments. Accordingly, all such changes and modifications are intended to be included within the scope of the invention as defined in the appended claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the particular embodiments disclosed, and that modifications to the disclosed embodiments, as well as other embodiments, are intended to be included within the scope of the appended claims.

What is claimed is:

1. A photoresist composition for forming a color filter, the composition comprising:
a binder resin comprising a copolymerized repeating unit, wherein the copolymerized repeating unit comprises a branch, wherein the branch comprises an epoxy group represented by Chemical Formula 9:

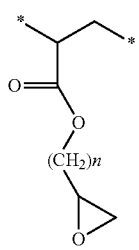

Chemical Formula 9 wherein n is 1 to 5;
a monomer;
a photo initiator;
a dye compound, wherein the dye compound is reactive with the binder resin, and comprises at least one functional group selected from a hydroxyl group, a carboxyl group, an amine group, and an isocyanate group; and
an organic solvent.

2. The photoresist composition of claim 1, comprising about 5% to about 10% by weight of the binder resin, about 5% to about 10% by weight of the monomer, greater than 0% to about 1% by weight of the photo initiator, and about 5% to about 10% by weight of the dye compound, each based on a total weight of the photoresist composition.

3. The photoresist composition of claim 1, wherein the binder resin is reactive with the monomer, the photo initiator is activated by a light and is reactive with the binder resin and the monomer, and the dye compound comprising the at least one functional group is reactive with the binder resin, wherein the epoxy group is activated by a heat.

4. The photoresist composition of claim 1, wherein the dye compound comprises a base group which is substituted with the functional group, and the base group comprises at least one selected from a xanthene, an anthraquinone, a perylene, a triphenyl methane, a porphyrazine, an azo, a styryl(2-methylpropyl benzene), a phthalocyanine, and an indigoid.

5. The photoresist composition of claim 1, wherein the amine group comprises a primary amine group or a secondary amine group, and the isocyanate group is represented by the following Chemical Formula A or Chemical Formula B:

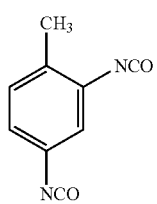

Chemical Formula A

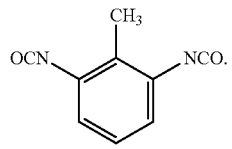

Chemical Formula B

6. A method of manufacturing a color filter for a display device, the method comprising:
disposing a photoresist composition for forming a color filter on a base substrate, the photoresist composition comprising
a binder resin comprising a copolymerized repeating unit comprising a branch comprising an epoxy group represented by Chemical Formula 9:

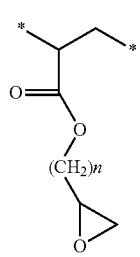

Chemical Formula 9 wherein n is 1 to 5,
a monomer,
a photo initiator,
a dye compound comprising at least one functional group selected from a hydroxyl group, a carboxyl group, an amine group, and an isocyanate group, and
an organic solvent;
photo-curing the photoresist composition with light to provide a photo-cured photoresist composition; and
thermo-curing the photo-cured photoresist composition to manufacture the color filter.

7. The method of claim 6, wherein the photo-curing the photoresist composition comprises irradiating the photoresist composition disposed on the base substrate with a light to activate the photo initiator and react the binder resin with the monomer to provide the photo-cured photoresist composition, and wherein the thermo-curing the photo-cured photoresist composition comprises heat treating the photo-cured photoresist composition disposed on the base substrate to react the at least one functional group of the dye compound with the binder resin to provide the color filter.

8. The method of claim 6, wherein the dye compound includes a base group which is substituted with the epoxy group, and the base group comprises at least one functional group selected from a xanthene, an anthraquinone, a perylene, a triphenyl methane, a porphyrazine, an azo, a styryl (2-methylpropyl benzene), a phthalocyanine, and an indigoid.

9. The method of claim 6, wherein the amine group comprises a primary amine group or a secondary amine group, and the isocyanate is represented by the following Chemical Formula A or Chemical Formula B:
Chemical Formula A
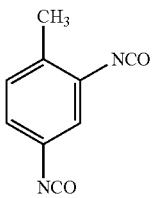
Chemical Formula B
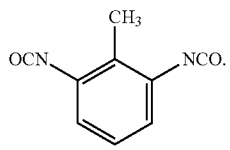
* * * * *